United States Patent
Nishiyama et al.

(10) Patent No.: US 9,871,152 B2
(45) Date of Patent: Jan. 16, 2018

(54) SOLAR CELL AND MANUFACTURING METHOD THEREOF

(71) Applicants: Aya Nishiyama, Tokyo (JP); Hiroyuki Fuchigami, Tokyo (JP); Hidetada Tokioka, Tokyo (JP)

(72) Inventors: Aya Nishiyama, Tokyo (JP); Hiroyuki Fuchigami, Tokyo (JP); Hidetada Tokioka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/399,018

(22) PCT Filed: Oct. 15, 2012

(86) PCT No.: PCT/JP2012/076642
§ 371 (c)(1),
(2) Date: Nov. 5, 2014

(87) PCT Pub. No.: WO2013/186945
PCT Pub. Date: Dec. 19, 2013

(65) Prior Publication Data
US 2015/0068594 A1    Mar. 12, 2015

(30) Foreign Application Priority Data
Jun. 13, 2012  (JP) .................................. 2012-133949

(51) Int. Cl.
*H01L 31/0236* (2006.01)
*H01L 31/0747* (2012.01)
(Continued)

(52) U.S. Cl.
CPC .. *H01L 31/02363* (2013.01); *H01L 31/02168* (2013.01); *H01L 31/03685* (2013.01);
(Continued)

(58) Field of Classification Search
CPC ............ H01L 31/02363; H01L 31/0747; H01L 31/02168; H01L 31/03685; H01L 31/186
See application file for complete search history.

(56) References Cited

U.S. PATENT DOCUMENTS 4,427,839 A * 1/1984 Hall ................ H01L 31/022458
                                                      136/255
5,024,953 A * 6/1991 Uematsu ............ H01L 21/3083
                                                      136/255
(Continued)

FOREIGN PATENT DOCUMENTS

JP      59 175170    10/1984
JP       7 95603    10/1995
(Continued)

OTHER PUBLICATIONS

International Search Report dated Nov. 13, 2012 in PCT/JP12/076642 Filed Oct. 15, 2012.
(Continued)

*Primary Examiner* — Golam Mowla
(74) *Attorney, Agent, or Firm* — Oblon, McClelland, Maier & Neustadt, L.L.P.

(57) ABSTRACT

To provide a solar cell that reduces occurrence of a defect and has high photoelectric conversion efficiency. The solar cell includes a silicon substrate such as an n-type single-crystal silicon substrate single crystal with pyramid-shaped irregularities P formed thereon, and an amorphous or micro-crystal semiconductor layer formed on the single-crystal silicon substrate. A flat part F is formed in a valley portion of the pyramid-shaped irregularities P provided on a surface of the single-crystal silicon substrate. With this configuration, a steep angle of 70° to 85° of a concave portion formed by a substantially (111) surface can be widened to between 115° and 135°. Accordingly, a change of atomic step morphology attributable to a rounded shape can be eliminated, (Continued)

thereby enabling to reduce epitaxial growth and defects in the amorphous or microcrystal semiconductor layer.

8 Claims, 14 Drawing Sheets

(51) Int. Cl.
*H01L 31/0216* (2014.01)
*H01L 31/0368* (2006.01)
*H01L 31/18* (2006.01)

(52) U.S. Cl.
CPC ........ *H01L 31/0747* (2013.01); *H01L 31/186* (2013.01); *Y02E 10/545* (2013.01); *Y02E 10/548* (2013.01); *Y02P 70/521* (2015.11)

(56) References Cited

U.S. PATENT DOCUMENTS

| | | | |
|---|---|---|---|
| 6,207,890 B1 | 3/2001 | Nakai et al. | |
| 6,313,397 B1 | 11/2001 | Washio et al. | |
| 6,380,479 B2 | 4/2002 | Nakai et al. | |
| 2003/0178057 A1* | 9/2003 | Fujii | H01L 31/022425 |
| | | | 136/256 |
| 2003/0201249 A1 | 10/2003 | Harker et al. | |
| 2005/0126627 A1* | 6/2005 | Hayashida | H01L 31/02363 |
| | | | 136/257 |
| 2008/0220559 A1 | 9/2008 | Fujii et al. | |
| 2012/0255603 A1* | 10/2012 | Yu et al. | 136/256 |

FOREIGN PATENT DOCUMENTS

| | | |
|---|---|---|
| JP | 2588464 | 12/1996 |
| JP | 2000 150937 | 5/2000 |
| JP | 3271990 | 4/2002 |
| JP | 2010 77010 | 4/2010 |
| JP | 2011 86902 | 4/2011 |
| JP | 2011 115987 | 6/2011 |
| WO | 98 43304 | 10/1998 |

OTHER PUBLICATIONS

Office Action dated Dec. 28, 2015 in Chinese Patent Application No. 201280073884.2 with partial English translation.
Notification of the Third Office Action dated Dec. 5, 2016 in Chinese Patent Application No. 201280073884.2 with Partial English Translation.
Combined Office Action and Search Report dated Mar. 10, 2017 in Chinese Patent Application No. 201280073884.2 (with partial English translation and English translation of categories of cited documents).

* cited by examiner

SOLAR CELL AND MANUFACTURING METHOD THEREOF

FIELD

The present invention relates to a solar cell and a manufacturing method thereof and, more particularly, to a solar cell using a crystalline silicon substrate having a texture structure having an antireflection structure and a manufacturing method of the solar cell.

BACKGROUND

In a solar cell in which incident light is converted to electricity by a photoelectric conversion unit, if the light reflected from the surface is large, the light entering the solar cell decreases, and the obtainable power thus decreases. Therefore, to increase the photoelectric conversion efficiency of the solar cell, it is essential to reduce the optical reflectance on the surface so that more light is taken in. An effective way to reduce the optical reflectance is, for example, to provide an antireflection film on the surface of the solar cell.

However, even if an antireflection film is used, a loss still occurs due to reflection of several percent of the incident light. Therefore, minute irregularities referred to as "texture" are further formed on the surface of the solar cell so that the reflectance is reduced due to an optical confinement effect.

For example, single-crystal silicon can be easily formed into a random pyramid-shaped irregular structure, as the texture, by using an alkaline solution to perform anisotropic etching. The optical reflectance on the surface of the solar cell can be considerably reduced by using these methods. However, a method of realizing a further reduction in the reflectance is already known. In this method, the texture structure has regularly arranged pyramid-shaped openings. A manufacturing method of the pyramid-shaped openings is already known in which an etching mask is formed on the surface of single-crystal silicon and the mask is then used to perform anisotropic etching. By regularly providing the pyramid-shaped texture on a light-receiving surface in this manner, the optical confinement effect due to multiple scattering can be increased further when compared with a random texture.

In a conventional solar cell that uses a crystalline silicon substrate, such as a single-crystal silicon substrate, a pyramid-shaped irregular shape (texture) due to the surface of (111) is formed on the surface of the silicon (100) substrate by performing anisotropic etching.

Furthermore, a heterojunction solar cell technique in which an amorphous silicon layer or a microcrystal silicon layer is laminated on a single-crystal silicon substrate to form a PN junction has been disclosed (Patent Literature 1). The problem is that with such a hetero-structure many defects occur at the heterojunction interface, and high conversion efficiency cannot be achieved. However, a solar cell technique having a structure has been disclosed in which a thin genuine amorphous silicon layer is sandwiched between a single-crystal silicon substrate and an amorphous silicon substrate to reduce the number of defects at the heterojunction interface (Patent Literature 2).

In the solar cell structure described above, because of the steep pyramid-shaped irregular shape formed on the silicon substrate, defects may occur in the amorphous silicon layer formed on the substrate, or the film thickness may become non-uniform, thereby resulting in a decrease in output characteristics. Patent Literature 3 discloses a technique in which isotropic etching is performed on a substrate that is provided with pyramid-shaped irregularities so that a rounded valley portion is formed, thereby solving the problems described above.

CITATION LIST

Patent Literatures

Patent Literature 1: Japanese Patent Application Laid-open No. S59-175170
Patent Literature 2: Japanese Patent Publication No. H7-95603
Patent Literature 3: Japanese Patent No. 3271990

SUMMARY

Technical Problem

The results of in-depth research have shown, however, that a performance upgrade may not be realized even by rounding the valleys in the texture as described in Patent Literature 3. This is because a change in the atomic step morphology appears through rounding the shape of the bottom of valleys of the texture, and thus epitaxial growth easily occurs in the amorphous silicon layer at the bottom part of the texture. Furthermore, it is thought that, because a (100) surface appears at the bottom part, epitaxial growth then easily occurs in the amorphous silicon layer, and defects are likely to occur. Therefore, an object of the present invention is to provide a solar cell that can reduce characteristic deterioration caused by the valley shape of the texture structure with excellent reproducibility, and to provide a manufacturing method of the solar cell.

Solution to Problem

To solve the problem and achieve the objective described above, the present invention relates to a crystalline solar cell in which a second conductive-type semiconductor layer is formed on a surface of a first conductive-type crystalline silicon substrate with a plurality of pyramid-shaped irregularities provided on the surface thereof. A valley portion of the pyramid-shaped irregularities provided on the surface of the crystalline silicon substrate includes a flat part.

Advantageous Effects of Invention

According to the present invention, because a valley portion of a pyramid-shaped convex portion has a flat part, an open-circuit voltage (Voc) and a fill factor (F.F.) can be improved when compared with existing technology, thereby enabling the reduction of characteristic deterioration due to the valley shape of a crystalline solar cell and the improvement of an output characteristics.

BRIEF DESCRIPTION OF DRAWINGS

FIG. 2-1 is a cross-sectional image view of an n-type single-crystal silicon substrate of the crystalline silicon solar cell according to the first embodiment of the present invention.

FIG. 2-2 is a planar image view of the n-type single-crystal silicon substrate of the crystalline silicon solar cell according to the first embodiment of the present invention.

FIG. 5-1 is a process sectional view explaining the texture forming process procedure for forming the n-type single-crystal silicon substrate having the texture structure, in the manufacturing method of the crystalline silicon solar cell according to the first embodiment of the present invention.

FIG. 5-2 is a process sectional view explaining the texture forming process procedure for forming the n-type single-crystal silicon substrate having the texture structure, in the manufacturing method of the crystalline silicon solar cell according to the first embodiment of the present invention.

FIG. 5-3 is a process sectional view explaining the texture forming process procedure for forming the n-type single-crystal silicon substrate having the texture structure, in the manufacturing method of the crystalline silicon solar cell according to the first embodiment of the present invention.

FIG. 5-4 is a process sectional view explaining the texture forming process procedure for forming the n-type single-crystal silicon substrate having the texture structure, in the manufacturing method of the crystalline silicon solar cell according to the first embodiment of the present invention.

FIG. 6-1 is a process sectional view illustrating a manufacturing process of the crystalline silicon solar cell according to the first embodiment of the present invention, using the n-type single-crystal silicon substrate having the texture structure.

FIG. 6-2 is a process sectional view illustrating the manufacturing process of the crystalline silicon solar cell according to the first embodiment of the present invention, using the n-type single-crystal silicon substrate having the texture structure.

FIG. 6-3 is a process sectional view illustrating the manufacturing process of the crystalline silicon solar cell according to the first embodiment of the present invention, using the n-type single-crystal silicon substrate having the texture structure.

FIG. 6-4 is a process sectional view illustrating the manufacturing process of the crystalline silicon solar cell according to the first embodiment of the present invention, using the n-type single-crystal silicon substrate having the texture structure.

FIG. 6-5 is a process sectional view illustrating the manufacturing process of the crystalline silicon solar cell according to the first embodiment of the present invention, using the n-type single-crystal silicon substrate having the texture structure.

FIG. 10-1 is a graph illustrating the relation between the normalized reflectance and the normalized Voc according to the first embodiment of the present invention.

FIG. 10-2 is a graph illustrating the relation between the length of a flat part of the valley portion and the normalized Voc according to the first embodiment of the present invention.

FIG. 11-1 is a process sectional view illustrating a manufacturing process of a crystalline silicon solar cell according to a second embodiment of the present invention, using a p-type single-crystal silicon substrate having the texture structure.

FIG. 11-2 is a process sectional view illustrating the manufacturing process of the crystalline silicon solar cell according to the second embodiment of the present invention, using the p-type single-crystal silicon substrate having the texture structure.

FIG. 11-3 is a process sectional view illustrating the manufacturing process of the crystalline silicon solar cell according to the second embodiment of the present invention, using the p-type single-crystal silicon substrate having the texture structure.

FIG. 12-1 is a cross-sectional image view of an n-type single-crystal silicon substrate of a crystalline silicon solar cell according to a third embodiment of the present invention.

FIG. 12-2 is a planar image view of the n-type single-crystal silicon substrate of the crystalline silicon solar cell according to the third embodiment of the present invention.

FIG. 14-1 is a process sectional view explaining the texture forming process procedure for forming the n-type single-crystal silicon substrate having the texture structure, in the manufacturing method of the crystalline silicon solar cell according to the third embodiment of the present invention.

FIG. 14-2 is a process sectional view explaining the texture forming process procedure for forming the n-type single-crystal silicon substrate having the texture structure, in the manufacturing method of the crystalline silicon solar cell according to the third embodiment of the present invention.

FIG. 14-3 is a process sectional view explaining the texture forming process procedure for forming the n-type single-crystal silicon substrate having the texture structure, in the manufacturing method of the crystalline silicon solar cell according to the third embodiment of the present invention.

FIG. 14-4 is a process sectional view explaining the texture forming process procedure for forming the n-type single-crystal silicon substrate having the texture structure, in the manufacturing method of the crystalline silicon solar cell according to the third embodiment of the present invention.

FIG. 14-5 is a process sectional view explaining the texture forming process procedure for forming the n-type single-crystal silicon substrate having the texture structure, in the manufacturing method of the crystalline silicon solar cell according to the third embodiment of the present invention.

FIG. 14-6 is a process sectional view explaining the texture forming process procedure for forming the n-type single-crystal silicon substrate having the texture structure, in the manufacturing method of the crystalline silicon solar cell according to the third embodiment of the present invention.

DESCRIPTION OF EMBODIMENTS

Figure 1:
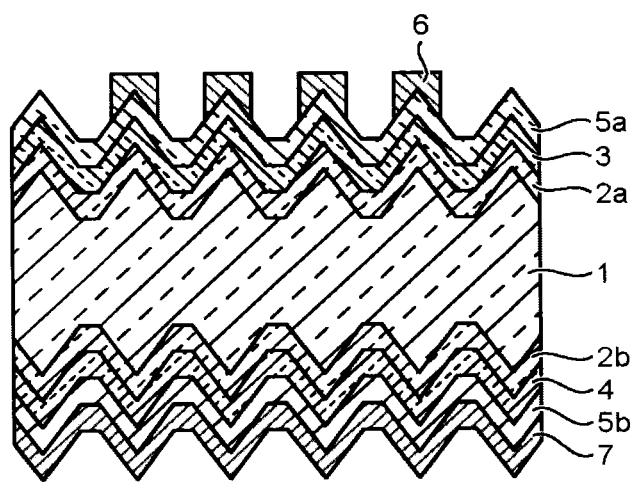
FIG. 1 is a schematic block diagram of a crystalline silicon solar cell according to a first embodiment of the present invention.

Exemplary embodiments of a solar cell and a manufacturing method thereof according to the present invention will be explained below in detail with reference to the accompanying drawings. The present invention is not limited to the following descriptions and can be modified as appropriate without departing from the scope of the invention. In addition, in the drawings explained below, for easier understanding, the scale of each component may be different from actuality. The same holds true for the relations between each of the drawings.

First Embodiment

Figures 1, 2:
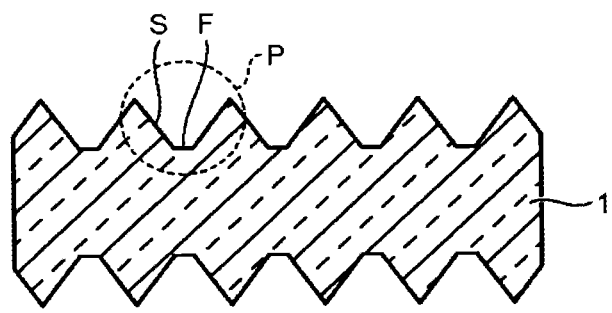
Figure 2:
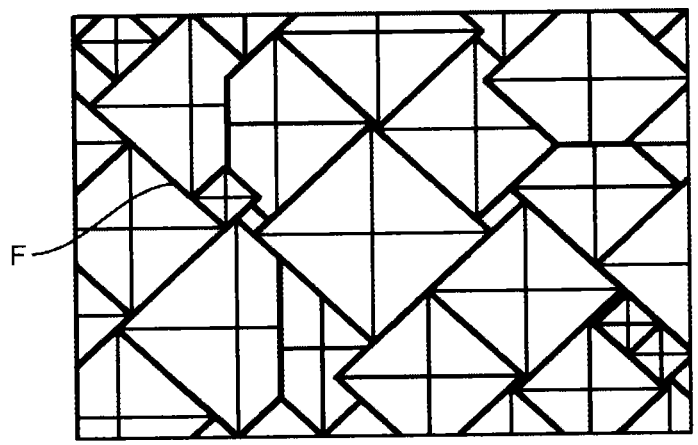

FIG. 1 illustrates a schematic configuration of a crystalline silicon solar cell of a solar cell according to a first embodiment of the present invention. FIGS. 2-1 and 2-2 are respectively a cross-sectional image view and a planar image view of an n-type single-crystal silicon substrate 1, which is the crystalline silicon substrate included in the solar cell. In the silicon solar cell, the n-type single-crystal silicon substrate 1 having a specific resistance of 1 Ω·cm to 10 Ω·cm and a thickness of between 50 micrometers and 300 micrometers, inclusive, with a main surface being constituted by the (100) surface, is used as the crystalline silicon substrate. Pyramid-shaped irregularities P with an apex of a valley portion constituting a flat part F are arranged in plural randomly on the surface of the n-type single-crystal silicon substrate 1. The irregularities P have a configuration in which the valley portion has a pyramid shape having the flat part F, and at least three sides of four bottom sides of the pyramid shape form the flat part F. S denotes a side surface of a pyramid-shaped convex portion. The surface of the n-type single-crystal silicon substrate 1 has the irregularities P. In practice, however, it can be considered that the configuration includes pyramid-shaped convex portions arranged to overlap on each other on the (100) surface.

i-type amorphous silicon layers 2a and 2b are formed on both surfaces of the n-type single-crystal silicon substrate 1 having the texture formed thereon. A p-type amorphous silicon layer 3 having a thickness of about 5 nanometers is formed on the i-type amorphous silicon layer 2a. An n-type amorphous silicon layer 4 having a thickness of about. 5 nanometers is formed on the i-type amorphous silicon layer 2b. The i-type amorphous silicon layers 2a and 2b act to repair defects on the substrate surface and improve the photoelectric conversion efficiency. Furthermore, the n-type amorphous silicon layer 4 formed with the i-type amorphous silicon layer 2b is a BSF (Back Surface Field) layer for efficiently capturing generated carriers. However, these i-type amorphous silicon layers 2a and 2b and the n-type amorphous silicon layer 4 do not necessarily need to be formed. Further, the texture structure can be formed only on a light-receiving surface side.

A transparent electrode 5a of ITO (indium tin oxide) or the like having a thickness of about 70nanometers is formed on the p-type amorphous silicon layer 3; and a collecting electrode 6 made of silver (Ag) having a thickness of about 60 micrometers is formed on the transparent electrode 5a. Meanwhile, a back electrode 7 made of silver (Ag) having a thickness of about 300 nanometers is formed on the whole n-type amorphous silicon layer 4 via a transparent electrode 5b.

Figure 3:
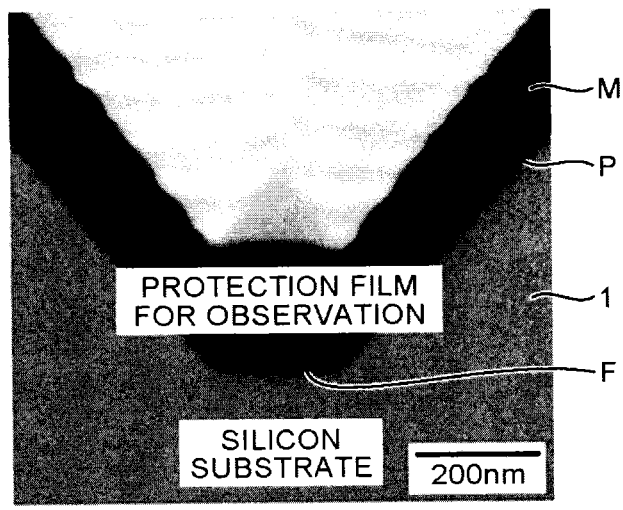
FIG. 3 is a sectional TEM image of a valley portion of the n-type single-crystal silicon substrate of the crystalline silicon solar cell according to the first embodiment of the present invention.

The cross-sectional image view of the n-type single-crystal silicon substrate 1 subjected to unevenness processing according to the first embodiment of the present invention is illustrated in FIG. 2-1; and the planar image view thereof is illustrated in FIG. 2-2. A sectional TEM image of the valley portion of the n-type single-crystal silicon substrate 1 is illustrated in FIG. 3. As illustrated in FIGS. 2-1 and 2-2, the flat part F having a fine width is formed in substantially all gaps between the bottom parts of the valley portions of the irregularities P in the texture structure based on a quadrangular pyramid. In other words, it is understood that the four sides of almost all of the valley portions of the texture are surrounded by narrow flat parts. The flat parts F are regions indicated by the thick line. In FIG. 3, it can be confirmed that by forming the flat parts F in the valley portions of the n-type single-crystal silicon substrate (the silicon substrate) 1, an angle of a concave portion is widened to between 115° and 135°, and the change of atomic step morphology does not appear. Note that M denotes a protection film for observation.

Figure 4:
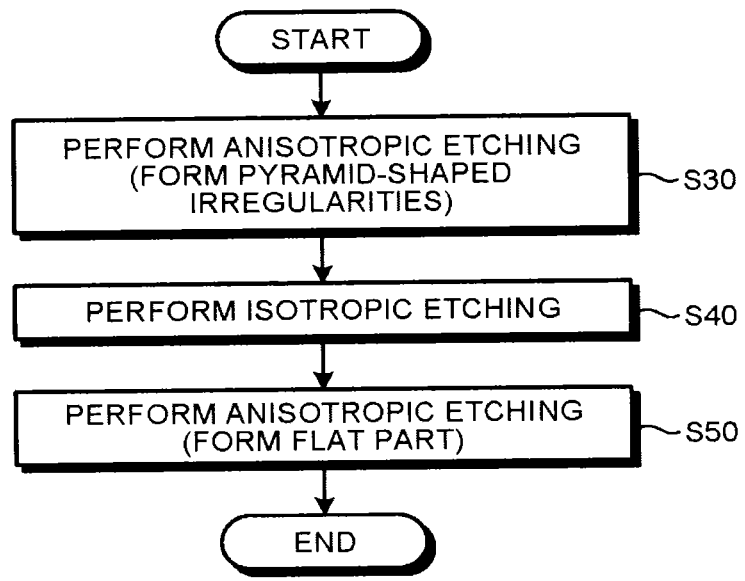
FIG. 4 is a flowchart explaining a texture forming process procedure for forming the n-type single-crystal silicon substrate having a texture structure, in the manufacturing method of the crystalline silicon solar cell according to the first embodiment of the present invention.
Figures 1, 5:
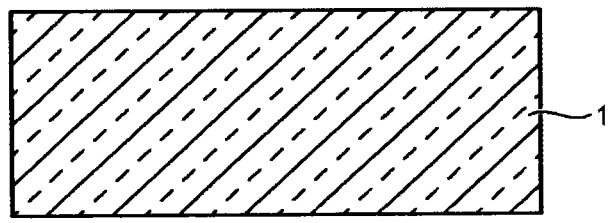
Figures 2, 5:
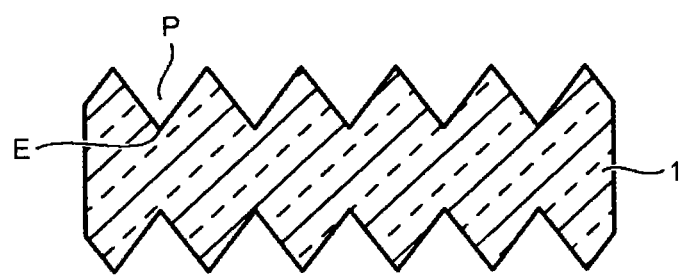
Figures 3, 5:
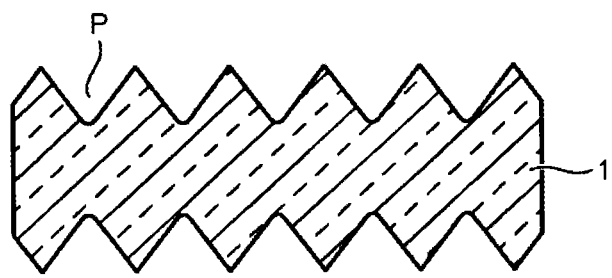
Figures 4, 5:
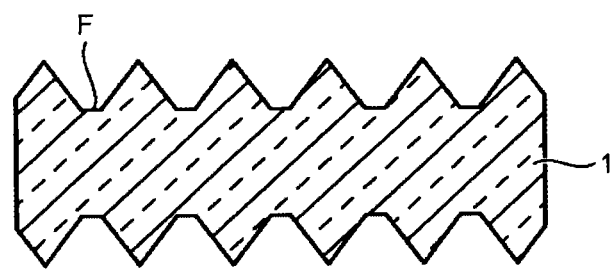
Figures 1, 6:
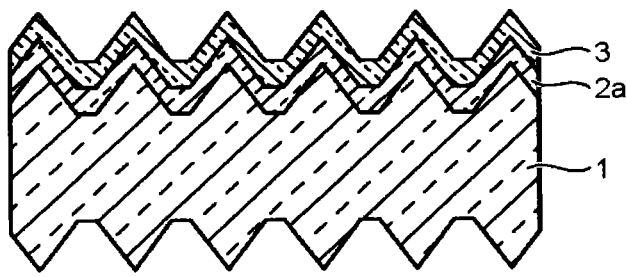
Figures 2, 6:
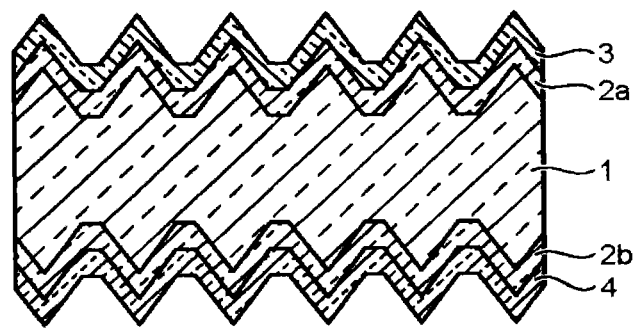
Figures 3, 6:
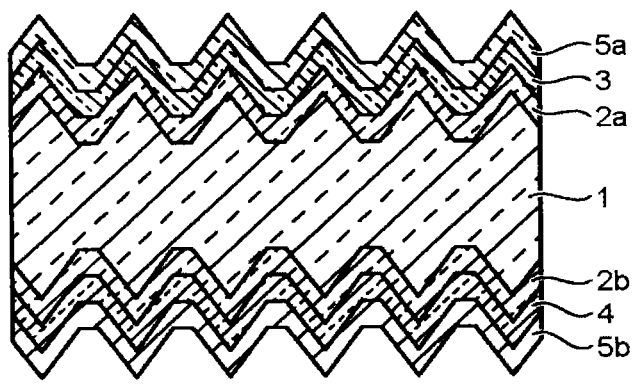
Figures 4, 6:
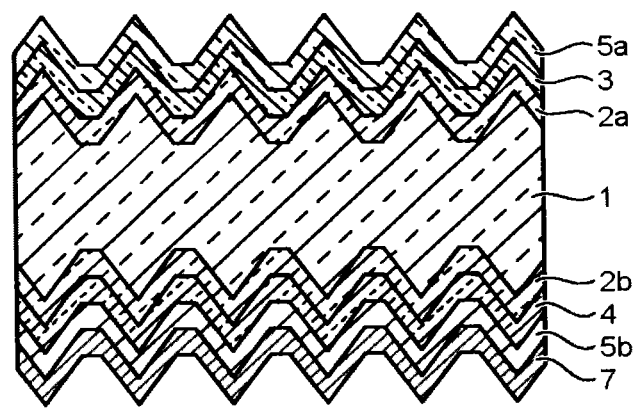
Figures 5, 6:
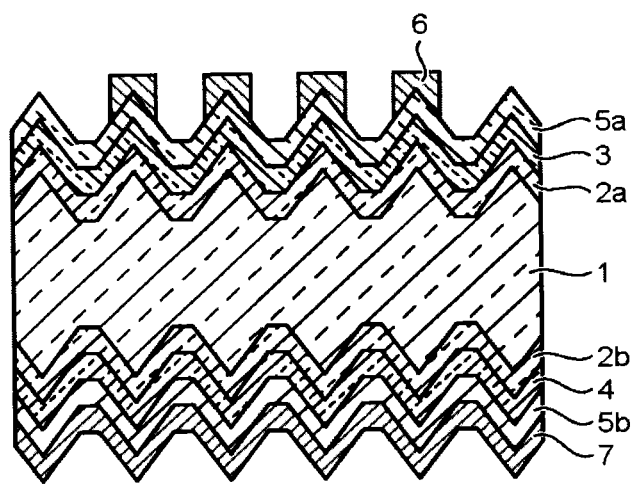

A manufacturing method of the crystalline silicon solar cell according to the first embodiment of the present invention is described next. FIG. 4 is a flowchart for explaining the texture forming process procedure for forming the n-type single-crystal silicon substrate having a texture structure in the manufacturing method of the crystalline silicon solar cell according to the first embodiment of the present invention. FIGS. 5-1 to 5-4 are process sectional views for explaining the texture forming process procedure for forming the n-type single-crystal silicon substrate having the texture structure in the manufacturing method of the crystalline silicon solar cell according to the first embodiment of the present invention. FIGS. 6-1 to 6-5 are process sectional views illustrating a manufacturing process of the crystalline silicon solar cell using the n-type single-crystal silicon substrate having the texture structure.

According to the manufacturing method of the solar cell of the present embodiment, etching is directly performed on the (100) surface of a first conductivity-type crystalline silicon substrate, without forming any anti-etching film, to form a texture in which pyramid-shaped convex portions are arranged to overlap with each other on the (100) surface. That is, the process of forming the texture structure includes a first step (Step S30) of performing anisotropic etching on the surface of the silicon substrate to form a plurality of pyramid-shaped irregularities; a second step (Step S40) of performing isotropic etching to round corner portions of the pyramid-shaped irregularities; and a third step (Step S50) of performing anisotropic etching subsequently to form a flat part in a valley portion of the pyramid-shaped irregularities.

The n-type single-crystal silicon substrate 1 with a crystal face orientation of a principal surface being (100) is first prepared as the substrate (FIG. 5-1). The n-type single-crystal silicon substrate 1 is sliced using a multi-wire saw from a single-crystal silicon ingot doped to be n-type having the desired concentration.

Subsequently, anisotropic etching is performed on the surface of the light-receiving surface side of the n-type single-crystal silicon substrate 1. In the anisotropic etching, for example, an alkaline solution containing organic matter in an appropriate amount is supplied to the surface of the n-type single-crystal silicon substrate 1. The alkaline solution used is, for example, a sodium hydroxide (NaOH) aqueous solution or a potassium hydroxide (KOH) aqueous solution. The concentration of these aqueous solutions is appropriately changed depending on the type of the organic matter to be added. For example, the alkali concentration is preferably between 1 wt % and 10 wt %, inclusive. The organic matter used, for example, is an alcohol such as isopropyl alcohol (IPA), organic sulfonic acid, or organic ester; and a surface acting agent or ether can be added. Furthermore, the temperature of these aqueous solutions at the time of etching is preferably between 70° C. and 90° C., inclusive. The etching time is preferably between 20 minutes and 40 minutes. By adding sulfonic acid, the surface can be smoothed.

When anisotropic etching is performed on the surface of the n-type single-crystal silicon substrate 1 by using the alkaline solution, etching proceeds on the (100) surface with a high etching rate. When the irregularities P formed only by the (111) surface having a quite low etching rate are formed, etching proceeds slowly. In this manner, the pyramid-shaped irregularities P are formed (Step S30, FIG. 5-2). FIG. 5-2 illustrates a situation in which the pyramid-shaped irregularities P having inclined planes with the crystal face orientation being (111) are formed.

The pyramid-shaped irregularities P have inclined planes with the crystal face orientation being (111). The pyramid-shaped irregularities P form protrusions in a quadrangular pyramid shape when the light-receiving surface of the n-type single-crystal silicon substrate 1 is placed upward; have a square shape in a planar view; and are also referred to as a "pyramid-shaped structure". Each pyramid-shaped irregularity P is formed by four inclined planes intersecting with each other, and the bottom part thereof forms the deepest part E in a concave shape.

Figure 7:
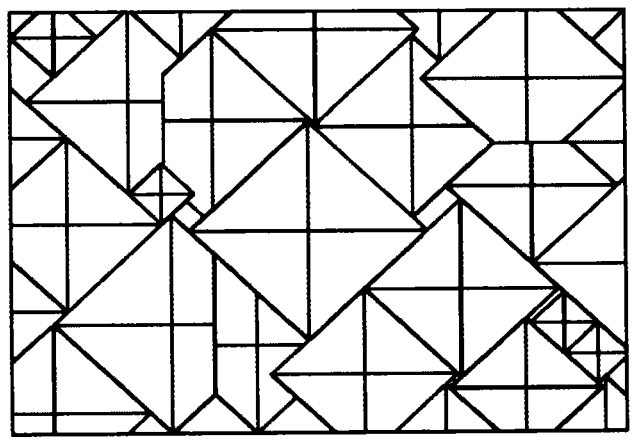
FIG. 7 is a planar image view of a crystal silicon substrate subjected to unevenness processing by anisotropic etching.
Figure 8:
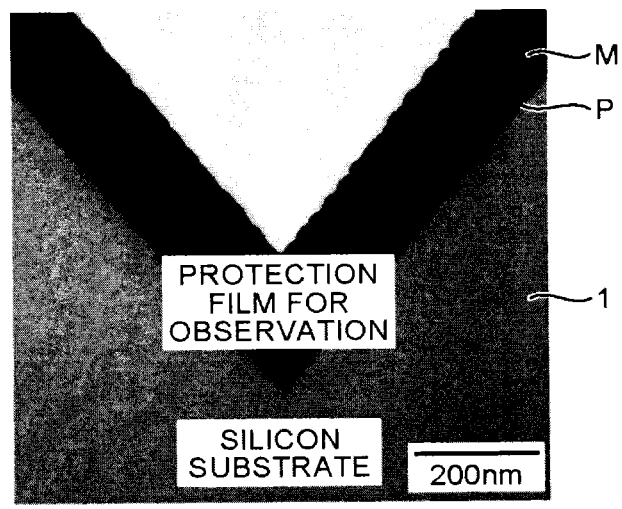
FIG. 8 is a sectional TEM image of a valley portion of a pyramid-shaped irregularity formed by anisotropic etching.

As illustrated in FIG. 5-2, surface treatment is performed so that the pyramid-shaped irregularities P, formed by a substantially (111) surface referred to as "texture", are formed on the surface of the n-type single-crystal silicon substrate 1. A planar image view of the n-type single-crystal silicon substrate 1 subjected to unevenness processing at this time is illustrated in FIG. 7; and a TEM image of the texture valley portion is illustrated in FIG. 8. At this time, a steep V-shaped groove of between 70° and 85° in cross section is formed by the (111) surface. During etching, the etching solution can be stirred. In this example, the irregularities P are formed on both the light-receiving surface and the back surface of the n-type single-crystal silicon substrate 1; however, the irregularities P can be formed on the light-receiving surface only. There is also a method of forming irregularities P referred to as "inverse pyramid structure" depending on the texture, and the method according to the present embodiment is also effective for a substrate with the texture having the inverse pyramid structure. Meanwhile, initial cleaning of the substrate can be performed before forming the irregularities P in order to reduce etching unevenness. Further, a process of removing a damaged layer on the substrate surface at the time of slicing by wet etching using an acid or alkaline solution can be performed. In addition, it is desired to perform a getterinq process on impurities in the substrate after the damaged-layer removal process in order to improve the performance. The gettering processes used include phosphorus diffusion process, or the like.

Figure 9:
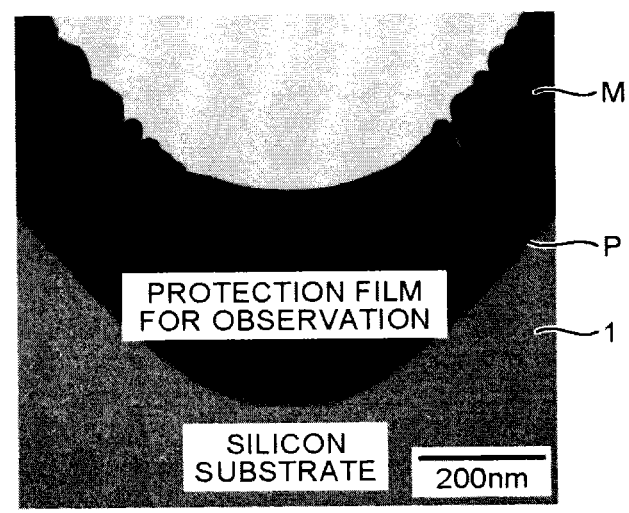
FIG. 9 is a sectional TEM image of a valley portion where isotropic etching is performed on the pyramid-shaped irregularities formed by anisotropic etching.

As illustrated in FIG. 5-3 (Step S40), isotropic etching is performed on the n-type single-crystal silicon substrate 1 formed with the irregularities P so as to round the valley portion. A TEM image of the texture valley portion at this time is illustrated in FIG. 9. The planar image view is the same as that illustrated in FIG. 2-2. The isotropic etching solution can be used is, a mixed liquid of hydrofluoric acid (HF) and nitric acid ($HNO_3$), a mixed liquid of hydrofluoric acid (HF), nitric acid ($HNO_3$), and acetic acid ($CH_3COOH$), or the like. By adjusting the concentration or processing time, the rounded shape of the valley portion can be controlled. Therefore, the condition of the concentration or processing time is not limited. For example, the n-type single-crystal silicon substrate 1 formed with the irregularities P is preferably immersed in an aqueous solution in which hydrofluoric acid (HF) and nitric acid ($HNO_3$) are mixed at a rate of 1:10 to 1:100 for 10 seconds to 5 minutes. During the etching, the etching solution can be stirred. Note that the isotropic etching is not limited to the wet etching and can be performed by dry etching.

Furthermore, anisotropic etching is performed to the n-type single-crystal silicon substrate 1 formed with the irregularities P having the rounded valley portions for a short time so as to form the flat part F in the valley portion (Step S50). In this manner, the n-type single-crystal silicon substrate 1, in which the irregularities P having the flat parts F in the valley portions are formed, is acquired as illustrated in FIG. 5-4.

According to the present embodiment, a phenomenon where the rounded valley portion becomes a flat shape by performing alkaline etching has been newly found. It is desired to use an aqueous solution of alkali metal hydroxide such as sodium hydroxide (NaOH) and potassium hydroxide (KOH), or an aqueous solution of an alkali metal carbonate such as sodium carbonate ($Na_2CO_3$) and potassium carbonate ($K_2CO_3$) as the anisotropic etching solution. For example, the n-type single-crystal silicon substrate 1 formed with the irregularities P having the rounded valley portions is immersed in a 0.1 wt % to 15 wt. % sodium hydroxide (NaOH) aqueous solution at a normal temperature for 5 seconds to 60 seconds. During the etching, the etching solution can be stirred. By following the above, the progress of the etching becomes uniform.

After the irregularities P having the flat parts F in the valley portions are formed in this manner, as illustrated in FIG. 6-1, the i-type amorphous silicon layer 2a and the p-type amorphous silicon layer 3 are formed in this order on one surface of the n-type single-crystal silicon substrate 1 by using a chemical vapor deposition (CVD) method. Each of the film thicknesses of the i-type amorphous silicon layer 2a and the p-type amorphous silicon layer 3 is respectively 5 nanometers. In the present embodiment, the film thickness is set to be 5 nanometers; however, the film thickness can be in a range of between 3 nanometers and 10 nanometers, inclusive, depending on the forming conditions of the layer. The desired CVD method used is plasma-enhanced CVD, thermal CVD, or the like. In order to generate a sufficient built-in electric field with respect to the n-type single-crystal silicon substrate 1 which is a photoelectric conversion layer, a bandgap and activation energy of the p-type amorphous silicon layer 3 need to be respectively 1.7 electron volts or greater, and 0.4 electron volts or lower. Note that instead of the type amorphous silicon layer 2a, an i-type amorphous silicon carbide layer, an i-type amorphous silicon oxide layer, or a multi-layer film, in which these silicon layers are laminated on each other, can be used. Further, instead of the p-type amorphous silicon layer 4, a p-type amorphous silicon carbide layer, a p-type amorphous silicon oxide layer, a p-type microcrystal silicon layer, or a multi-layer film, in which these silicon layers are laminated on each other, can be used.

Accordingly, the flat part F is formed at the bottom part of the irregularities P that make the steep V-shaped groove of between 70° and 85° in cross section by the (111) surface, so that the angle of the groove can be thereby widen to between 115° and 135°. Therefore, the (100) surface can be reduced by another 10% to 20% than can the substrate with the bottom part of the groove being rounded.

After the i-type amorphous silicon layer 2a and the p-type amorphous silicon layer 3 are formed on one surface of the n-type single-crystal silicon substrate 1 in this manner, the i-type amorphous silicon layer 2b and the n-type amorphous silicon layer 4 are formed in this order on the opposite side of the light-receiving surface of the n-type single-crystal silicon substrate 1 as illustrated in FIG. 6-2 by using the chemical vapor deposition (CVD) method. Each of the film thicknesses of the i-type amorphous silicon layer 2b and the n-type amorphous silicon layer 4 is 5 nanometers. In the present embodiment, the film thickness is set to 5 nanometers; however, the film thickness can be in a range between 3 nanometers and 20 nanometers, inclusive, depending on the forming conditions of the layer. The desired CVD used is plasma-enhanced CVD, thermal CVD, or the like. In order to generate a sufficient built-in electric field in the n-type single-crystal silicon substrate 1 that is the photoelectric conversion layer, the bandgap and activation energy of the n-type amorphous silicon layer 4 need to be, respectively, 1.7 electron volts or greater, and 0.3 electron volts or lower. Note that instead of the i-type amorphous silicon layer 2b, an i-type amorphous silicon carbide layer, an i-type amorphous silicon oxide layer, or a multi-layer film in which these silicon layers are laminated on each other can be used. Further, instead of the n-type amorphous silicon layer 4, an n-type amorphous silicon carbide layer, an n-type amorphous silicon oxide layer, an n-type microcrystal silicon layer, or a multi-layer film in which these silicon layers are laminated on each other can be used.

After the i-type amorphous silicon layer 2b and the n-type amorphous silicon layer 4 are formed on one surface of the n-type single-crystal silicon substrate 1 in this manner, a thermal annealing process can be performed thereon in an inert gas or a hydrogen gas diluted by the inert gas in order to reduce interface defects in the i-type amorphous silicon layer and the n-type single-crystal silicon substrate 1. The annealing temperature is desirably equal to or lower than 200° C.

After the thermal annealing process, as illustrated in FIG. 6-3, the transparent electrodes 5a and 5b are formed respectively on the p-type amorphous silicon layer 3 and the n-type amorphous silicon layer 4 by using a sputtering method or a vapor deposition method. From the viewpoint of the reduction of reflectance, it is desired that the film thickness of the transparent electrodes 5a and 5b is approximately 70 nanometers. The transparent electrode material used is a transparent conductive oxide of indium tin oxide (ITO) or indium oxide ($In_2O_3$). It is also desired that the resistivity of the transparent electrodes 5a and 5b is low. If the carrier density that supports conductivity is high, light absorptivity increases; therefore, the material used as the transparent electrodes 5a and 5b needs to have high mobility. It is desired that the mobility is equal to or higher than 100 $cm^2/Vs$ in order to achieve a sufficiently low resistivity in a case with a film thickness of 70 nanometers. The transparent electrode material used on the lower layer side is zinc oxide (ZnO) with aluminum (Al) or gallium (Ga) added.

After the transparent electrode 5b is formed on the n-type amorphous silicon layer 4, as illustrated in FIG. 6-4, the back electrode 7 made of silver (Ag) is formed on the transparent electrode 5b by the sputtering method or the vapor deposition method. The film thickness of the back electrode 7 is approximately 300 nanometers, and silver (Ag) is used as the material thereof. Instead of forming the back electrode 7, a collecting electrode made of silver (Ag) can be formed on the transparent electrode 5b by a screen printing method or a plating method. It is desired that the material of the back electrode 7 has high reflectance and conductivity; and aluminum (Al), gold (Au), or copper (Cu) can be used instead of silver (Ag).

After the transparent electrode 5a is formed on the p-type amorphous silicon layer 3, as illustrated in FIG. 6-5, the collecting electrode 6 made of silver (Ag) is formed on the transparent electrode 5a by the screen printing method. As for the width of a grid electrode constituting the collecting electrode 6, narrower is better in order to reduce light interception; however, being narrower increases the resistance. Therefore, it is desired that the grid electrode has a narrow width and a thick film thickness. In the present embodiment, the width is set to be 50 micrometers and the film thickness is set to be 60 micrometers. Note that the collecting electrode 6 can be formed by the plating method as well as a screen printing method. After the printing of the collecting electrode 6, a firing is performed at a temperature of 200° C. or lower. It has been confirmed by TEM observation that the shape of the valley portion of the irregular structure of the crystalline silicon solar cell formed in this manner is changed from the shape of a crystalline silicon solar cell Ref-I of a comparative example 1 illustrated in FIG. 8 and the shape of a crystalline silicon solar cell Ref-II of a comparative example 2 illustrated in FIG. 9 to a shape having the flat part F as illustrated in FIG. 3.

Subsequently, the following are prepared: the crystalline silicon solar cell manufactured by the above method; the crystalline silicon solar cell Ref-I of the comparative example 1 in which only pyramid-shaped irregularities are formed on the n-type single-crystal silicon substrate 1, manufactured under the same conditions as the solar cell according to the present embodiment; and the crystalline silicon solar cell Ref-II of the comparative example 2 in which the irregularities P with the valley portions rounded are formed on the n-type single-crystal silicon substrate 1, manufactured under the same conditions as the solar cell according to the present embodiment. Results obtained by measuring the solar cell characteristics are illustrated in Table 1.

TABLE 1

| | Jsc (mA/cm$^2$) | Voc (V) | F.F. (—) | η (%) |
|---|---|---|---|---|
| Present embodiment | 37.3 | 0.708 | 0.780 | 20.6 |
| Comparative example 1 Ref-I shape | 37.5 | 0.658 | 0.761 | 18.8 |
| Comparative example 2 Ref-II shape | 37.3 | 0.681 | 0.769 | 19.5 |

As is obvious from Table 1, in the crystalline silicon solar cell according to the present embodiment, the open-circuit voltage (Voc) and the fill factor (F.F.) increase by a greater proportion than the proportional decrease of the short-circuit current Jsc associated with the morphology change of the valley portion, thereby enabling the improvement of the conversion efficiency (%) when compared with the crystalline silicon solar cell Ref-I of the comparative example 1. As the length of the flat part increases, the reflectance increases and the Jsc decreases. Therefore, the formation of the flat part means that the Voc and F.F. and the Jsc have a trade-off relation. It is also understood that the characteristics of the crystalline silicon solar cell according to the present embodiment are such that the increase in the amounts of the open-circuit voltage (Voc) and the fill factor (F.F.) are large and the improvement effect of the conversion efficiency is large when compared to the crystalline silicon solar cell Ref-II of the comparative example 2. The F.F. stands for "fill factor"; is a numerical value expressing a ratio of maximum output to theoretical output; and is considered as an indication of the quality of a solar cell module. The theoretical output corresponds to a product of an open-circuit voltage and a short-circuit current. The maximum value of the F.F. is set to be 1 when the maximum output is the same as the theoretical output, and it indicates that, as the numerical value approaches 1, the power generation efficiency is high.

Figures 1, 10:
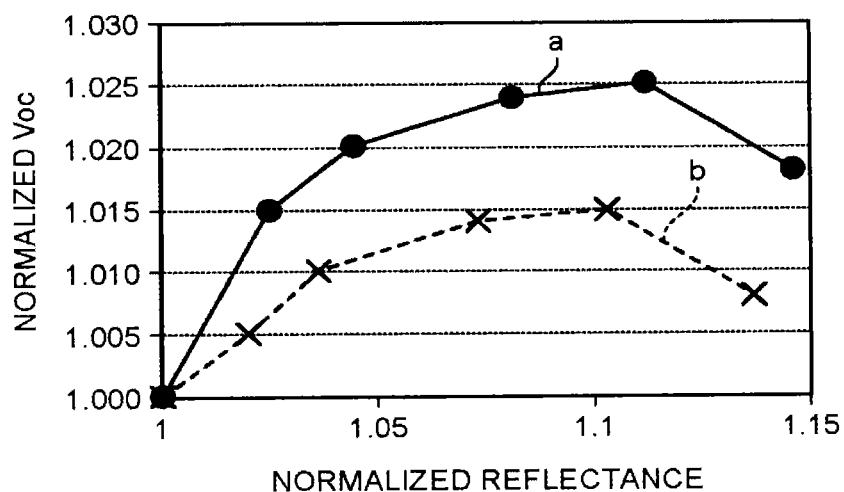
Figures 2, 10:
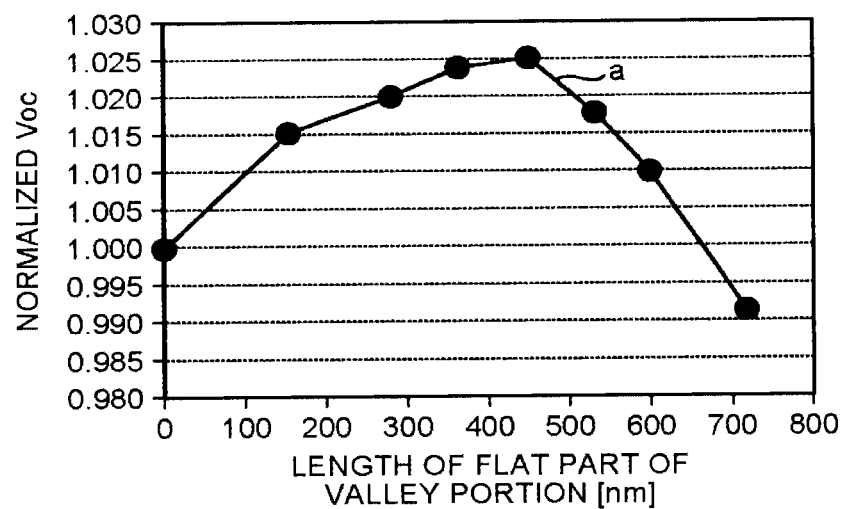

FIG. 10-1 is a graph illustrating the relation between the normalized reflectance of an n-type single-crystal silicon substrate having rounded valley portions and the n-type single-crystal silicon substrate 1 having the flat part F in the valley portion of the present invention; and the normalized Voc of a crystalline silicon solar cell manufactured by using the n-type single-crystal silicon substrate 1. The normalization was performed on the basis of the reflectance and Voc of the crystalline silicon solar cell Ref-I of the comparative example 1 in which additional machining has not been performed on the texture valley portion. A curved line "a" indicates the line of the n-type single-crystal silicon substrate 1 of the first embodiment, that is, a substrate in which additional machining is performed on the texture valley portion to form the flat part F. A curved line "b" indicates the line of a substrate of the crystalline silicon solar cell Ref-II of the comparative example 2 in which the texture valley portion is rounded. It can be confirmed from this graph that the crystalline silicon solar cell of the present embodiment improves the Voc more than the crystalline silicon solar cell Ref-II of the comparative example 2 does. It can be considered that this is because the defects and epitaxial growth of a passivation film due to the steep valley shape can be reduced by widening the angle of the concave portion in the crystalline silicon solar cell of the present embodiment. From the results of repeated experiments, it has been found that when having similar reflectance, the n-type single-crystal silicon substrate 1 of the crystalline silicon solar cell according to the present embodiment can reduce the (100) surface by 10% to 20% more than the crystalline silicon solar cell Ref-II of the comparative example 2 in which the bottom, part of the groove is rounded. Therefore, according to the crystalline silicon solar cell of the present embodiment, the epitaxial growth and occurrence of defects in the amorphous film attributable to the (100) surface can be reduced, thereby enabling the improvement of the photoelectric conversion efficiency.

Furthermore, when the shape of the crystalline silicon solar cell Ref-II of the comparative example 2 and the crystalline silicon solar cell of the present embodiment, which have the similar reflectances, are compared, it is understood that the crystalline silicon solar cell of the present embodiment has a larger increase in the amount of the Voc than the crystalline silicon solar cell Ref-II of the comparative example 2 has. It can be considered that this is because in the shape having the flat part F in the valley portion, the (100) surface and approximate (100) surface regions, which are generated in association with the shape machining of the valley portion, decrease and there is no change of atomic step morphology in association with the rounded shape compared with the shape having the rounded valley portion. As a result of obtaining a one-dimensional region of the (100) surface and the approximate (100) surface in the valley portion from the sectional TEM image, in a substrate having a similar reflectance, the solar cell according to the present embodiment has a smaller one-dimensional region of the (100) surface and the approximate (100) surface than the crystalline silicon solar cell Ref-II of the comparative example 2 by approximately 10% to 20%.

In addition, in the valley shape of the substrate in the crystalline silicon solar cell Ref-II of the comparative example 2, there is an atomic step change associated with the rounded shape. In contrast, the valley shape of the substrate in the solar cell according to the present embodiment is constituted by the substantially (111) surface and the substantially (100) surface. Therefore, it is considered that the solar cell according to the present embodiment can reduce the number of defects and epitaxial growth of the passivation film caused by the atomic step structural change as seen in the crystalline silicon solar cell Ref-II of the comparative example 2.

From the above descriptions, it is considered that the n-type single-crystal silicon substrate 1 having the valley structure according to the first embodiment can further reduce defects and epitaxial growth of the passivation film, when compared with the crystalline silicon solar cell Ref-II of the comparative example 2.

FIG. 10-2 is a graph illustrating the relation between the length of the flat part F of the valley portion and the Voc. A curved line "a" illustrates a relation between the length of the flat part F and the Voc in the n-type single-crystal silicon substrate 1 of the first embodiment. From this graph, it has been found that the crystalline silicon solar cell according to the first embodiment has an effect of improving the Voc when the length of the flat part is equal to or less than 600 nanometers. It has been founded that if the length of the flat part F is too long, the reflectance of the n-type single-crystal silicon substrate 1 increases, the short-circuit current Jsc largely decreases, and simultaneously defects and epitaxial growth attributable to the (100) surface are considerably caused in the passivation film, so that a sufficient effect cannot be acquired. In consideration of FIG. 10-2 and a decreased amount of the Jsc, it can be understood that a more appropriate length of the flat part F is equal to or less than 500 nanometers. Further, it has been confirmed by additional experiments conducted thereafter that when the length of the flat part is approximately 50 nanometers, the normalized reflectance and the normalized Voc are respectively 1.011 and 1.009; and thus even when the length of the flat part is 50 nanometers, the effect of improving the Voc can be acquired.

In the heterojunction type solar cell according to the present embodiment, the n-type single-crystal silicon substrate 1, which has the pyramid structure formed therein and the flat part F in the valley portion, is thus used. Therefore, the steep angle of the concave portion formed by the substantially (111) surface can be widened, thereby enabling the elimination of the change of atomic step morphology caused by the rounded shape and the reduction of the (100) surface and approximate (100) surface region one-dimensionally by 10% to 20% compared with a substrate having a similar reflectance and a rounded valley portion. Accordingly, the epitaxial growth and defects in an amorphous film attributable to the steep texture shape or rounded shape and the (100) surface can be suppressed. Therefore, a semiconductor film having low optical reflectance on the surface and fewer defects can be formed. Consequently, the open-circuit voltage Voc and F.F. improve greater proportion than the proportional decrease of the short-circuit current Jsc in association with the morphology change, thereby enabling the improvement of the output characteristic of the crystalline silicon solar cell and the realization of a solar cell having high photoelectric conversion efficiency.

Second Embodiment

Figures 1, 11:
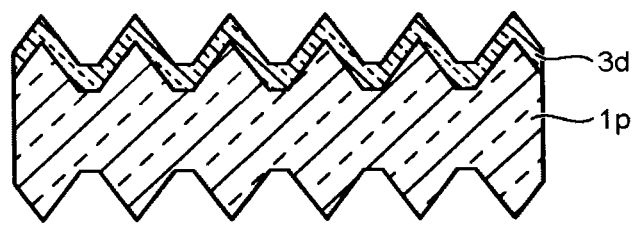
Figures 2, 11:
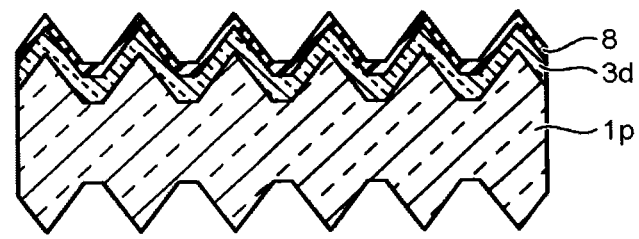
Figures 3, 11:
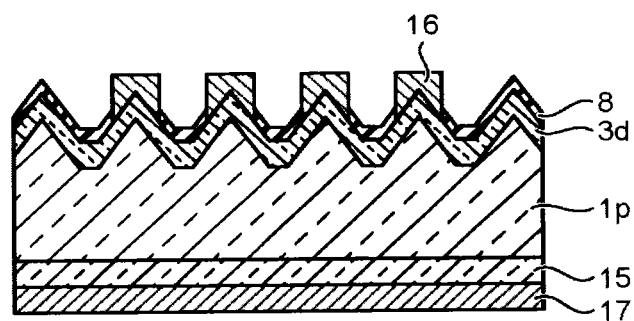

FIGS. 11-1 to 11-3 are process sectional views illustrating a manufacturing step of a crystalline silicon solar cell according to a second embodiment of the present invention using a p-type single-crystal silicon substrate 1p that has a texture structure. In the first embodiment, explained has been a thin-film solar cell in which the i-type amorphous silicon layer 2a and the p-type amorphous silicon layer 3 formed by an amorphous thin film are formed on the substrate surface having the texture structure by the CVD method. The present embodiment is applied to a junction type solar cell in which an n-type silicon diffusion layer is formed on the p-type single-crystal silicon substrate 1p by diffusion so as to form a pn junction. The present embodiment is different from the first embodiment in that, instead of the p-type amorphous silicon layer that forms the pn junction with the n-type single-crystal silicon substrate in the first embodiment, the present embodiment includes an n-type silicon diffusion layer 3d formed on the surface of the p-type single-crystal silicon substrate 1p by diffusion. On the other hand, on a reverse surface side thereof, a p-type silicon diffusion layer (a BSF layer) 15 is formed by diffusion at the time of firing a back electrode 17 formed of an aluminum layer or the like. On the reverse surface, silicon and aluminum that are melted at the time of firing the back electrode 17 at a high temperature and the texture disappears to form a flat shape. However, the texture structure is originally formed on both the surface and the reverse surface.

The n-type silicon diffusion layer 3d is first formed by diffusion on a light-receiving surface of a first conductive-type crystalline silicon substrate such that the p-type single-crystal silicon substrate 1p on which the pyramid structure or inverse pyramid structure similar to that of the first embodiment is formed, thereby forming a pn junction (FIG. 11-1). For example, the p-type single-crystal silicon substrate 1p having been subjected to the texture forming process described above is put into a thermal diffusion furnace and is heated in the presence of vapor of phosphorous oxychloride ($POCl_3$) so as to form phosphorous glass on the surface of the p-type single-crystal silicon substrate 1p, so that phosphorous is diffused on the p-type single-crystal silicon substrate 1p. The n-type silicon diffusion layer 3d is formed as a second conductive layer to form the pn junction. Because the p-type silicon substrate is used here, different conductive type phosphorous is diffused in order to form the pn junction. However, when an n-type silicon substrate is used, it suffices that p-type impurities are diffused. The diffusion method includes gas phase diffusion, solid phase diffusion, and application diffusion, and is formed, for example, by combining a step of forming a diffusion source on the surface of the silicon substrate using an ink jet method and a step of diffusing the diffusion source into the silicon substrate by annealing.

Subsequently, the phosphorous glass layer on the p-type single-crystal silicon substrate 1p is removed in a hydrofluoric acid solution, and the second conductive layer formed on the surface other than the light-receiving surface of the p-type single-crystal silicon substrate 1p is removed (pn separation). Thereafter, a dielectric film 8 having a passivation effect and an anti-reflection effect is formed on the light-receiving surface side of the p-type single-crystal silicon substrate 1p, for example, by the CVD method (FIG. 11-2). As a material of the dielectric film 8 having the passivation effect and the anti-reflection effect, provided is a material that contains any or at least one of SiN ($Si_3N_4$), SiO, and $Al_2O_3$. A film thickness and a refraction index of the dielectric film 8 is set to an optimum value, taking into consideration a value of suppressing optical reflection or a value of terminating a surface defect, so that both of these values are satisfied. Note that a layer having a different refractive index can be deposited thereon. Further, the dielectric film 8 can be formed by a different film-forming method such as the sputtering method.

Subsequently, a paste containing silver is printed in a comb shape on the light-receiving surface of the p-type single-crystal silicon substrate 1p by using the screen printing method or the like to form a light-receiving surface side electrode 16; and a paste containing aluminum is printed over the whole surface of the reverse surface to form the back electrode 17. Thereafter, a firing process at 800° C. is performed. Due to the firing process on the light-receiving surface side, the light-receiving surface side electrode 16 penetrates the dielectric film 8 and comes in contact with the n-type silicon diffusion layer 3d. Meanwhile, on the reverse surface side, metal such as aluminum of the back electrode 17 is diffused on the p-type single-crystal silicon substrate 1p to form the p-type silicon diffusion layer (the BSF layer) 15, so that a diffused junction-type solar cell is acquired (FIG. 11-3).

The solar cell according to the second embodiment is different from the first embodiment in the configuration that a semiconductor layer (a silicon layer) having a desired impurity concentration is formed by impurity diffusion, instead of the amorphous thin film formed by the film-forming method such as the CVD method in the solar cell according to the first embodiment.

Conventionally, when a diffusion layer is formed on a surface of a semiconductor substrate having the texture structure, defects are easily caused due to the concentration of impurities in a passivation film formed on a light-receiving surface of the substrate, in the valley portion of the pyramid-shaped irregularities; and thus sufficient photoelectric conversion efficiency cannot be acquired. Contrarily, according to the present embodiment, by forming the flat part F at the bottom part of the valley portion of the pyramid-shaped irregularities, occurrence of a defect in the valley portion can be reduced, thereby enabling to improve the photoelectric conversion efficiency.

In the embodiment described above, the single-crystal silicon substrate, used, is formed such that the valley portion of the pyramid-shaped irregularities has the flat part F. However, by forming the valley portion having the flat part F also in a texture structure having an inverse pyramid-shaped concave portion, the dielectric film 8 having less defects can be formed similarly to the first embodiment. This is due to: the decrease of the (100) surface or approximate (100) surface region generated in association with the shape machining of the valley portion; and elimination of a change of atomic step morphology due to rounding. Even when the pn junction is formed on the surface by diffusion and the dielectric film 8 is formed thereon, a film having high crystallinity can be formed. It has become clear that the dielectric film 8 has a function as the anti-reflection film because of a difference in the refractive index between the silicon substrate and the dielectric film, and plays a considerably important role of preventing recombination of carriers generated in a pn junction part. It has been found that improving the film quality of the dielectric film 8 contributes a considerably important role in improvement of the photoelectric conversion efficiency of the solar cell.

Needless to mention, the present embodiment can be applied not only to the junction-type solar cell in which an n-type silicon diffusion layer is formed on a p-type silicon substrate by diffusion to form the pn junction, but also to a junction-type solar cell in which a p-type silicon diffusion layer is formed on an n-type silicon substrate by diffusion to form the pn junction.

Third Embodiment

Figures 1, 12:
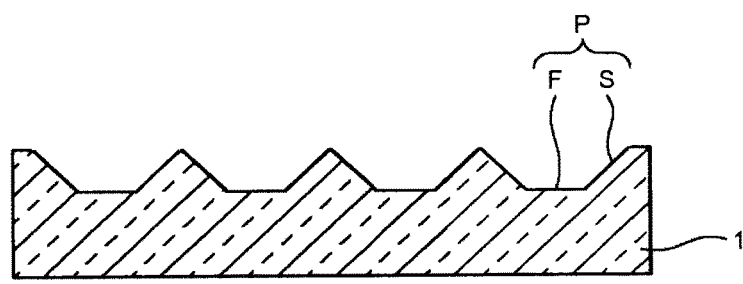
Figures 2, 12:
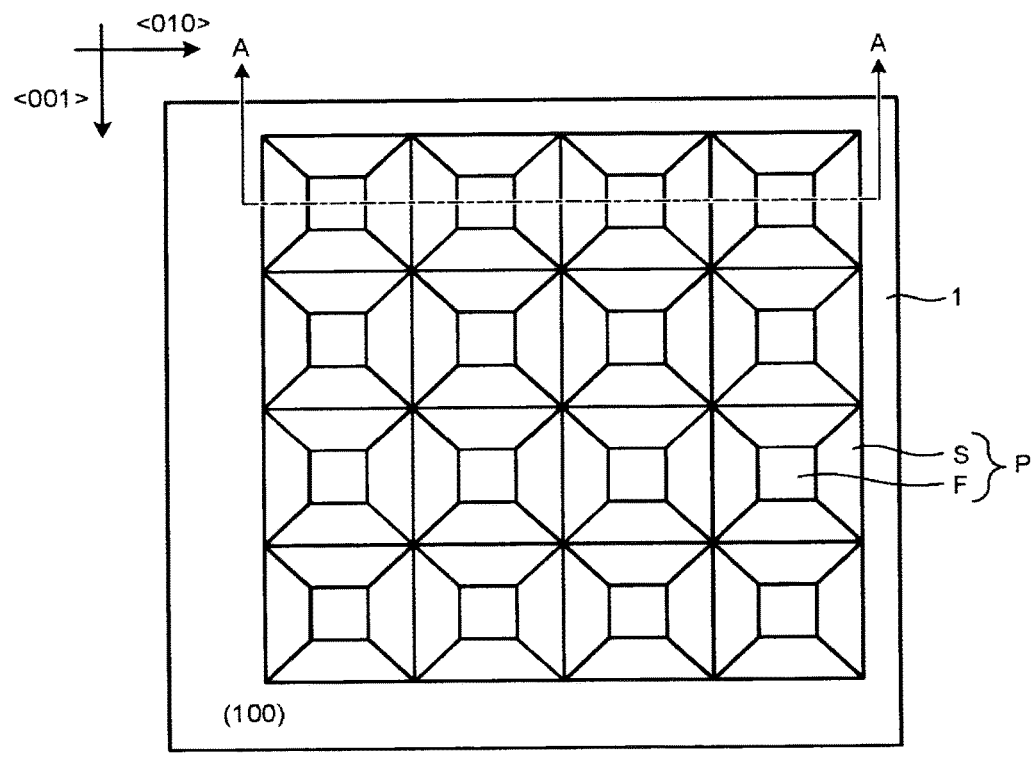

FIGS. 12-1 and 12-2 are respectively a cross-sectional image view and a planar image view of the n-type single-crystal silicon substrate 1 as the crystalline silicon substrate constituting a crystalline silicon solar cell according to a third embodiment of the present invention. FIG. 12-1 is a sectional view along a line A-A in FIG. 12-2. In the silicon solar cell, similarly to the first embodiment, used as the crystalline silicon substrate is the n-type single-crystal silicon substrate 1 having a specific resistance of 1 Ω·cm to 10 Ω·cm and a thickness of between 50 micrometers and 300 micrometers, inclusive, with a main surface being constituted by the (100) surface. Many inverse pyramid-shaped irregularities P with an apex of a valley portion constituting the flat part F are regularly arranged on the surface of the n-type single-crystal silicon substrate 1. The irregularities P is formed to have such a configuration where an inverse pyramid shape has the flat part F in a valley portion formed by four ridge lines, which forms a substantially square flat part F on an inverse pyramid-shaped bottom surface. S denotes a side surface of the inverse pyramid-shaped concave portion.

The structure of the solar cell of the third embodiment is the same as that of the solar cell of the first embodiment except the fact that the surface texture shape is different, and thus explanations thereof will be omitted.

As illustrated in FIGS. 12-1 and 12-2, the flat part F which is continuous to the four ridge lines is formed at the bottom part of the valley portion of the irregularities P in the texture structure, which is regularly arranged on the basis of an inverse quadrangular pyramid-shaped (inverse pyramid-shaped) concave. In other words, the substantially square flat part F is provided in the valley portion of the texture.

Figure 13:
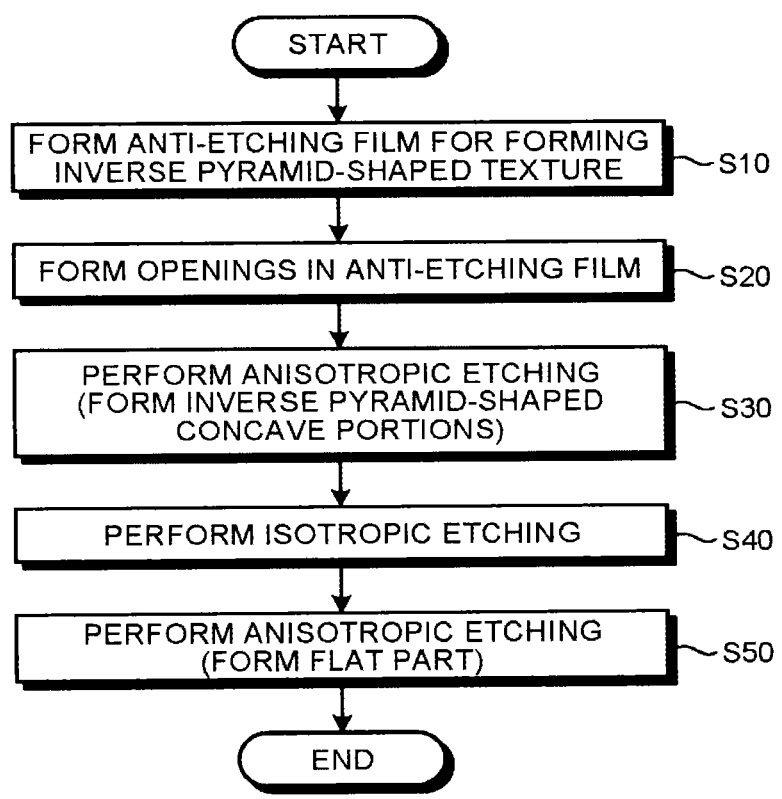
FIG. 13 is a flowchart explaining a texture forming process procedure for forming the n-type single-crystal silicon substrate having a texture structure, in the manufacturing method of the crystalline silicon solar cell according to the third embodiment of the present invention.
Figures 1, 14:
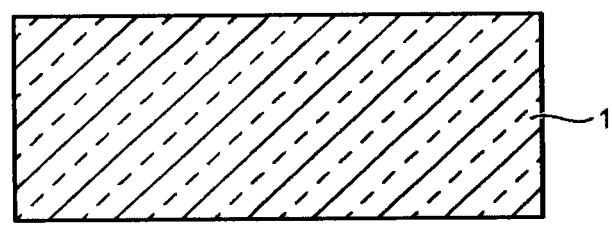
Figures 2, 14:
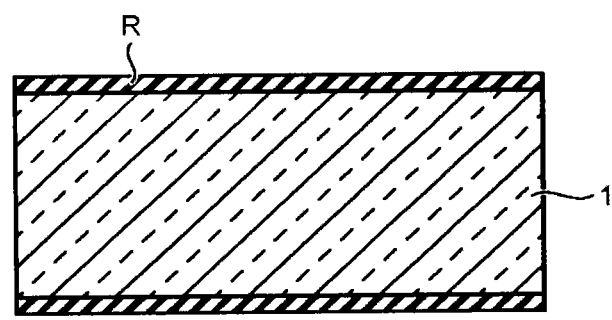
Figures 3, 14:
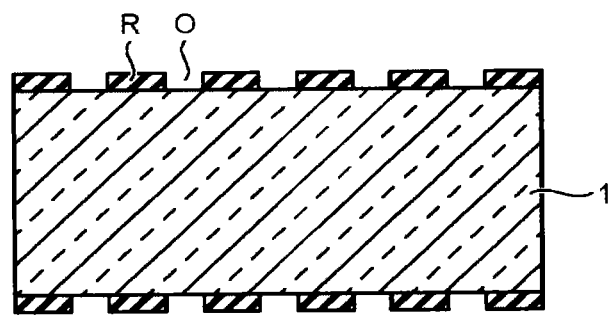
Figures 4, 14:
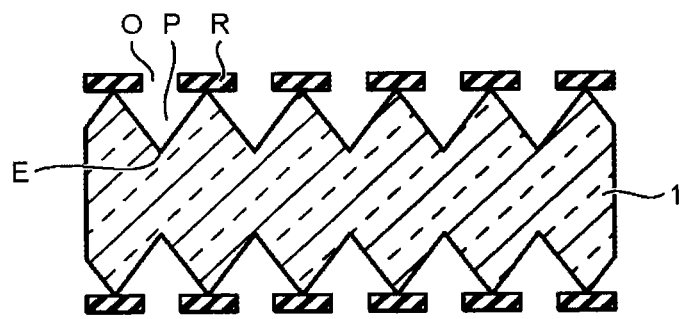
Figures 5, 14:
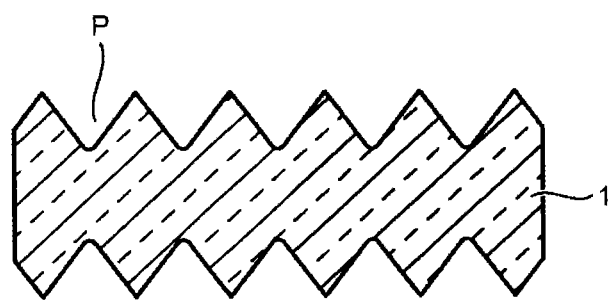
Figures 6, 14:
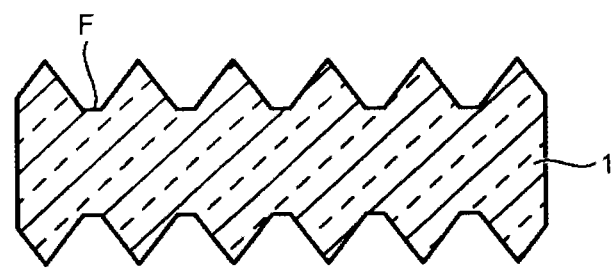

A manufacturing method of the crystalline silicon solar cell according to the third embodiment of the present invention is explained next. FIG. 13 is a flowchart for explaining a texture forming process procedure for forming the n-type single-crystal silicon substrate having a texture structure in the manufacturing method of the crystalline silicon solar cell according to the third embodiment of the present invention. FIGS. 14-1 to 14-6 are sectional views for explaining the texture forming process procedure for forming the n-type single-crystal silicon substrate having the texture structure in the manufacturing method of the crystalline silicon solar cell according to the third embodiment of the present invention. The manufacturing process of the crystalline silicon solar cell using the n-type single-crystal silicon substrate having the texture structure is the same as that explained in the first embodiment with reference to the process sectional views in FIGS. 6-1 to 6-5, and thus explanations thereof will be omitted.

In the manufacturing method of the solar cell according to the present embodiment, a step of forming a texture structure includes: forming an anti-etching film on the surface of a silicon substrate (Step S10); a step of forming openings on the anti-etching film by using a photolithography or laser machining to form an anti-etching film having the openings regularly arranged at a regular interval (Step S20); a first step of forming a plurality of pyramid-shaped irregularities P in lower parts of the openings and in vicinity regions thereof by performing anisotropic etching using the anti-etching film as a mask (Step S30); a second step of performing isotropic etching to round corner portions of the inverse pyramid-shaped irregularities P (Step S40); and a third step of performing anisotropic etching to form the flat part F in the valley portion of the pyramid-shaped irregularities P (Step S50).

The n-type single-crystal silicon substrate 1 with a crystal face orientation of a principal surface being (100) is first prepared as the substrate (FIG. 14-1). The n-type single-crystal silicon substrate 1 is sliced by a multi-wire saw from a single-crystal silicon ingot doped to the n-type having a desired concentration.

Subsequently, an anti-etching film R, which is to be an etching mask at the time of forming the inverse pyramid-shaped texture, is formed on a surface which is a light-receiving surface side of the n-type single-crystal silicon substrate 1 and a reverse surface opposite thereto (Step S10, FIG. 14-2). FIG. 14-2 illustrates a state where the anti-etching film R is formed on the surface which is the light-receiving surface side of the n-type single-crystal silicon substrate 1 having the crystal face orientation (100) and the reverse surface which is opposite thereto.

As the material of the anti-etching film R to be used as the etching mask, an inorganic resist made of an inorganic material is used as well as an organic resist made of an organic material such as light-sensitive resin made of a polymer material. Particularly, an inorganic material is preferable as the material of the anti-etching film R in the present embodiment, and for example, a silicon oxide film or a silicon nitride film can be used. As a film-forming method of the anti-etching film R, it is preferable to employ a method having less damage to the n-type single-crystal silicon substrate 1, and an ALD (Atomic Layer Deposition) method can be employed, as well as a normal pressure CVD (Chemical Vapor Deposition) method, an LPCVD (Low Pressure Chemical Vapor Deposition) method, and a PECVD (Plasma-Enhanced Chemical Vapor Deposition) method. In the present embodiment, a case where an inorganic resist made of an inorganic material is employed as the anti-etching film R is explained.

A plurality of openings O regularly arranged vertically and horizontally at a regular interval, which are used as openings for etching, are formed in the anti-etching film R so that an etching mask is formed (Step S20, FIG. 14-3). The openings O are arranged in a matrix in a planar direction of the n-type single-crystal silicon substrate 1.

As a method of forming the opening O, a chemical method such as the photolithographic method is used, when the polymer material is used for the anti-etching film R. Meanwhile, when the inorganic material is used for the anti-etching film R, a physical method such as a laser is used to perform drawing directly; or an organic resist pattern is formed by using the photolithography, which is then used as a mask to perform etching, thereby enabling to perform patterning. As the laser for machining the anti-etching film R, a laser that does not permeate silicon is preferable, and for example, it suffices that a laser having a wavelength of 532 nanometers which is the second harmonic of an Nd:YAG laser is used. Further, when machining of the anti-etching film R is performed by the laser, it is preferable to use a material in which hydrogen is contained in a film as the anti-etching film R.

As described above, the method of forming the openings O in the anti-etching film R made of an inorganic material by laser machining and performing etching to the n-type single-crystal silicon substrate 1 from the openings O has excellent productivity and has many advantages. The method of forming the etching mask by using the lithography has more excellent accuracy than the laser machining. However, in the surface machining of the n-type single-crystal silicon substrate 1 by the anisotropic etching, even if there are variations in the shape of the openings O, the influence on the optical reflectance is negligible, and cannot be a demerit of the laser machining. Rather, even when the n-type single-crystal silicon substrate 1 itself is not completely polished smoothly and has irregularities due to slicing process, the laser machining method can form the etching mask without a problem, and can have identical effects.

The openings O are formed so as to leave a regular island-shaped pattern in the planar direction of the anti-etching film R. That is, the anti-etching film R is formed in a matrix in the planar direction of the anti-etching film R, with the square region as a unit forming region corresponding to the shape of the inverse pyramid-shaped irregularities P being formed on the n-type single-crystal silicon substrate 1 by etching. The respective openings O illustrated in FIG. 14-3 are arranged in a <010> axial direction and a <001> axial direction with respect to the (100) surface of the n-type single-crystal silicon substrate 1. The shape is in a direction overlapping on the ridge line where the (111) surfaces exposed by etching intersect with each other, as viewed from a direction vertical to the (100) surface, at the time of promoting etching of the (111) surface of the n-type single-crystal silicon substrate 1.

Subsequently, by using the anti-etching film R as a mask, anisotropic etching is performed through the openings O onto the surface of the light-receiving surface side of the n-type single-crystal silicon substrate 1. In the anisotropic etching, for example, the n-type single-crystal silicon substrate 1 is immersed in an alkaline solution to supply the alkaline solution to the surface of the n-type single-crystal silicon substrate 1 through the openings O of the anti-etching film R. As the alkaline solution, for example, a sodium hydroxide (NaOH) aqueous solution or a potassium hydroxide (KOH) aqueous solution is used. The concentration of these aqueous solutions is preferably from 3 wt % to 10 wt % inclusive, and organic matter such as isopropyl alcohol (IPA) or a surface acting agent can be added. Further, the temperature of these aqueous solutions at the time of etching is preferably from 70° C. to 90° C. inclusive. The etching time is preferably from 20 minutes to 40 minutes. If anisotropic etching can be performed through the openings O onto the light-receiving surface of the n-type single-crystal silicon substrate 1, the n-type single-crystal silicon substrate 1 does not necessarily be immersed in the alkaline solution.

When the anisotropic etching is performed to the surface of the n-type single-crystal silicon substrate 1 by the alkaline solution, etching proceeds on the surface (100) having a high etching rate; and when the irregularities P formed only by the (111) surface having a considerably low etching rate are formed, progress of etching becomes slow. When the anisotropic etching is performed by using the etching mask having the openings O arranged in a matrix in the <010> axial direction and the <001> axial direction, the inverse pyramid-shaped irregularities P are formed below the openings O (Step S30, FIG. 14-4). FIG. 14-4 illustrates a state where the inverse pyramid-shaped irregularities P having inclined planes with the crystal face orientation of (111) being formed.

The inverse pyramid-shaped irregularities P have the inclined planes with the crystal face orientation of (111). In the inverse pyramid-shaped irregularities P, quadrangular pyramid-shaped concave portions are formed when the light-receiving surface of the n-type single-crystal silicon substrate 1 is set upward, and have a square shape in a planar view, which are also referred to as "inverse pyramid-shaped structure". Each of the respective inverse pyramid-shaped irregularities P is formed by four inclined planes intersecting with each other; and the bottom part thereof forms the deepest part E in a concave shape.

As illustrated in FIG. 14-4, surface treatment is performed so that the inverse pyramid-shaped irregularities P formed by the substantially (111) surface referred to as "texture" are formed on the surface of the n-type single-crystal silicon substrate 1. In order to reduce etching unevenness, initial cleaning of the substrate can be performed before forming the anti-etching film R. Further, a process of removing a damaged layer on the substrate surface can be performed. In addition, it is desired to perform the gettering process of impurities in the substrate after the damaged-layer removal process for improving the performance. As the gettering process, a phosphorus diffusion process, or the like is used.

As illustrated in FIG. 14-5 (Step S40), isotropic etching is performed to the n-type single-crystal silicon substrate 1 formed with the irregularities P so as to round the valley portion. The planar image view is the same as that illustrated in FIG. 12-2. As the isotropic etching solution, a mixed liquid of hydrofluoric acid (HF) and nitric acid ($HNO_3$), a mixed liquid of hydrofluoric acid (HF), nitric acid ($HNO_3$), and acetic acid ($CH_3COOH$), or the like can be used. By adjusting the concentration or processing time, the rounded shape of the valley portion can be controlled. Therefore, the condition of the concentration or processing time is not necessarily limited. For example, the n-type single-crystal silicon substrate 1 formed with the irregularities P is preferably immersed in an aqueous solution in which hydrofluoric acid (HF) and nitric acid ($HNO_3$) are mixed at a rate of 1:10 to 1:100 for 10 seconds to 5 minutes. During the etching, the etching solution can be stirred. The anti-etching film is also removed by this etching. The isotropic etching is not limited to the wet etching and can be performed by dry etching.

Furthermore, anisotropic etching is performed for a short time onto the n-type single-crystal silicon substrate 1 provided with the irregularities P having the rounded valley portions, so that the flat part F in the valley portion is formed (Step S50). The n-type single-crystal silicon substrate 1, in which the inverse pyramid-shaped irregularities P having the flat parts F in the valley portions are formed, is acquired as illustrated in FIG. 14-6.

In this manner, the irregularities P, in which the inverse pyramid-shaped concave portions having the flat parts F in the valley portions are regularly arranged, can be formed. After forming the irregularities P in this manner, as in the first embodiment, the i-type amorphous silicon layer 2a and the p-type amorphous silicon layer 3 are formed in this order on one surface of the n-type single-crystal silicon substrate 1 so as to form the pn junction, thereby forming the solar cell.

Accordingly, also in the solar cell according to the present embodiment, by forming the flat parts F at the bottom part of the irregularities P which have been constituting the steep V-shaped groove of 70° to 85° in cross section by the (111) surface, the bottom part of the irregularities P can be widened to 115° C. to 135° C. Therefore, the (100) surface can be reduced by 10% to 20% compared with the substrate with the bottom part of the groove being rounded.

Through the first to third embodiments, the single-crystal silicon substrate has been explained. However, the present invention is not limited to the single-crystal silicon substrate, and is also applicable to a case of using a polycrystal silicon substrate. When a polycrystal silicon substrate is used, the shape of the pyramid portion becomes random, and there is a problem that the change of atomic step morphology occurs in the valley portion in association with the rounding of the valley portion; and a defect is likely to occur in the amorphous silicon layer laminated on the substrate. However, by applying the present invention, such a defect can be avoided, and a solar cell having high photoelectric conversion efficiency can be provided.

Furthermore, by forming a plurality of cells formed by the solar cell having the configuration explained in the first to third embodiments and electrically connecting the adjacent solar cells in series or in parallel, a solar cell module having an excellent optical confinement effect and excellent photoelectric conversion efficiency can be provided. In this case, for example, it suffices that an electrode layer on a light-receiving surface side and an electrode layer on the other reverse surface side of the adjacent solar cells are electrically connected.

INDUSTRIAL APPLICABILITY

As described above, the solar cell and the manufacturing method thereof according to the present invention are useful for realizing a solar cell having a pyramid-shaped texture structure and having low optical reflectance and high photoelectric conversion efficiency.

REFERENCE SIGNS LIST

1 n-type single-crystal silicon substrate, 1*p* p-type single-crystal silicon substrate, 2*a*, 2*b* i-type amorphous silicon layer, 3 p-type amorphous silicon layer, 3*d* n-type silicon diffusion layer, 4 n-type amorphous silicon layer, 5*a*, 5*b* transparent electrode, 6 collecting electrode, 7 back electrode, 8 dielectric film, P irregularity, F flat part, S side surface, 15 p-type silicon diffusion layer, 16 light-receiving surface side electrode, 17 back electrode.

The invention claimed is:

1. A crystalline solar cell, comprising:
a first conductive-type crystalline silicon substrate having a light-receiving surface and a back surface; and
a second conductive-type semiconductor layer formed on the light receiving surface of the first conductive-type crystalline silicon substrate;
wherein the light-receiving surface of the first conductive-type substrate comprises a textured structure having a plurality of pyramid-shaped convex irregularities which taper in a direction from the back surface to the light-receiving surface,
a flat part is located at a bottom of a valley portion between two adjacent-pyramid-shaped irregularities,
an angle of a groove between the pyramid-shaped irregularities is from 115 to 135°,
the plurality of pyramid-shaped irregularities are surrounded by the flat parts, and
the flat parts comprise the second conductive-type semiconductor layer.

2. The solar cell according to claim 1, wherein
the pyramid-shaped irregularities are formed by arranging pyramid-shaped convex portions to overlap on each other on a (100) surface of the first conductive-type crystalline silicon substrate.

3. The solar cell according to claim 1, wherein the crystalline silicon substrate is a single-crystal silicon substrate.

4. The solar cell according to claim 1, wherein
the second conductive-type semiconductor layer is an amorphous or microcrystal semiconductor layer.

5. The solar cell according to claim 1, wherein
one side of the flat part of the valley portion of an irregularity is 600 nanometers or less.

6. The solar cell according to claim 5, wherein
the second conductive-type semiconductor layer is an amorphous or microcrystal semiconductor layer formed by a CVD method.

7. The solar cell according to claim 5, wherein
the second conductive-type semiconductor layer is formed by impurity diffusion, and
a dielectric layer is formed on a surface of the second conductive-type semiconductor layer.

8. The solar cell according to claim 7, wherein
the dielectric layer comprises at least one of silicon nitride, silicon oxide, or aluminum oxide.

* * * * *